United States Patent
Kidron

(10) Patent No.: US 8,763,999 B2
(45) Date of Patent: Jul. 1, 2014

(54) STAGE STRUCTURE FOR OPERATION IN VACUUM

(75) Inventor: Eitan Kidron, Hod Hasharon (IL)

(73) Assignee: Applied Materials Israel, Ltd., Rehovot (IL)

( * ) Notice: Subject to any disclaimer, the term of this patent is extended or adjusted under 35 U.S.C. 154(b) by 801 days.

(21) Appl. No.: 12/913,606

(22) Filed: Oct. 27, 2010

(65) Prior Publication Data

US 2011/0095466 A1    Apr. 28, 2011

Related U.S. Application Data

(60) Provisional application No. 61/255,418, filed on Oct. 27, 2009.

(51) Int. Cl.
*B25B 1/00* (2006.01)
(52) U.S. Cl.
USPC .................................. 269/56; 269/55
(58) Field of Classification Search
USPC .................... 269/56, 55, 43, 21, 8
See application file for complete search history.

(56) References Cited

U.S. PATENT DOCUMENTS

| | | | | |
|---|---|---|---|---|
| 4,409,860 A * | 10/1983 | Moriyama et al. | ......... | 74/490.09 |
| 4,896,869 A * | 1/1990 | Takekoshi | ......... | 269/60 |
| 7,330,093 B2 * | 2/2008 | Asano et al. | ......... | 335/220 |
| 7,900,896 B2 * | 3/2011 | Fujita | ......... | 269/58 |
| 7,959,141 B2 * | 6/2011 | Makino | ......... | 269/58 |
| 8,517,363 B2 * | 8/2013 | Makino et al. | ......... | 269/73 |
| 2010/0283986 A1 * | 11/2010 | Shibazaki | ......... | 355/72 |
| 2011/0102761 A1 * | 5/2011 | Yoshimoto | ......... | 355/72 |

* cited by examiner

*Primary Examiner* — Lee D Wilson
(74) *Attorney, Agent, or Firm* — Kilpatrick Townsend & Stockton LLP

(57) ABSTRACT

A method and a stage structure for use in a vacuum environment, the stage structure includes a first low-outgassing plate and first high-outgassing associated components that are encapsulated by first low-outgassing covering elements, wherein the first low-outgassing plate is arranged to be coupled to a first motor that is arranged to move the first low-outgassing plate along a first direction, an outgassing level of each of the first low-outgassing plate and the first low-outgassing covering elements does not exceed a tolerable level of outgassing in the vacuum environment, and an outgassing level of each first high-outgassing associated component is above the tolerable level of outgassing in the vacuum environment.

21 Claims, 19 Drawing Sheets

10

Vacuum chamber 80
Vacuum pump 88.
Stage structure 90
First low-outgassing plate 100(1)
Second low-outgassing plate 100(2)
Low-outgassing base plate 100(0)
First low-outgassing rail 700(1)
Second low-outgassing rail 700(2)
Third low-outgassing rail 700(3)
Fourth low-outgassing rail 700(4)
First low-outgassing magnet channel 300
Second low-outgassing magnet channel 300(2)
Low-outgassing chuck 620
First low-outgassing slide 710(1)
Second low-outgassing slide 710(2)
Third low-outgassing slide 710(3)
Fourth low-outgassing slide 710(4)
Third enclosure 110(3)
Water leak detectors 750
Vacuum system detectors 752

102(2)

Second motor 30(2)
High-outgassing cables 330(2) 520(2) 935(2)
High-outgassing coils 400(2)
High-outgassing coils frame 405(2)
High-outgassing encoder read head 505(2)
High-outgassing water tubes 930(2).

102(1)

First motor 30
High-outgassing coils 400
High-outgassing cables 330
High-outgassing cables 530
High-outgassing coils frame 405
High-outgassing encoder read head 505
High-outgassing cables 935
High-outgassing water tubes 930.

104(1)

First set of low-outgassing bellows 120(1)
Rigid sealed tubes 130(1)
First junction box 110(1)
First motor coil enclosure 310
First encoder enclosure 500
Low-outgassing fluid junction box 940
Set of low-outgassing bellows 920.

104(2)

Second set of low-outgassing bellows 120(2)
Rigid sealed tubes 130(2)
Second junction box 110(2)
Second motor coil enclosure 310(2)
Second encoder enclosure 500(2).

STAGE STRUCTURE FOR OPERATION IN VACUUM

RELATED APPLICATIONS

This application is a NONPROVISIONAL of and claims priority to U.S. provisional patent application No. 61/255,418, filed Oct. 27, 2009, which is incorporated herein in its entirety.

FIELD OF THE INVENTION

The present invention is directed to stage structures for operation in vacuum environments.

BACKGROUND

As critical dimensions (CD) are getting smaller and smaller, cleanliness requirements of high-vacuum environments become more and more demanding. Wherever a sensitive process (e.g., a manufacturing or inspection process) is performed in vacuum, there are requirements for the allowed molecular contents in the vacuum, which defines the level of cleanliness.

Some of the molecules contained in a vacuum chamber are already present in the air or are attached to the surfaces of the chamber prior to pumping. Other molecules outgas from solid and/or fluid materials inside the vacuum chamber, for example from the stage carrying the wafer and its associated components. Therefore, in cases where high levels of cleanliness are required, materials having low outgassing and low vapor pressure characteristics are used. The list of such materials includes, among others: stainless steel, glass, ceramics, copper and aluminum. Other materials (with medium or even low outgassing characteristics, so-called "compromise materials") needed for mechanical and electrical modules inside the vacuum chamber contribute to the contamination of the vacuum. Such materials are carefully selected and undergo dedicated cleaning process. The list of compromise materials includes, among others: PTFE (polytetrafluoroethylene) elements, PTFE coated electrical cables, elastomers, adhesives, lubricants and electrical components. Nevertheless, such materials are a source for contaminants due to, e.g., outgassing.

Dynamic effects also contribute to the contamination of vacuum, for example: cables that are continuously bent by reciprocating motion tend to break mechanically after long run times. This is the last step of a continuous process of molecules being damaged and outgassed. Also, lubricants interact under the mechanical load of bearings, and some of the molecules are damaged and outgassed.

There is a continuous trend of developing sensitive processes in vacuum, such as semiconductor wafer manufacturing, inspection and process control processes. These state of the art processes, and the layers of semiconductor devices subjected to or formed by such processes, tend to be more sensitive to cleanliness than in the past. Consider, for example, a SEM (scanning electron microscope) that is used for process control (e.g., inspection, metrology and review). A specimen (e.g., a wafer) is placed in vacuum and is exposed to contaminants outgassed from the various materials from which the SEM is built. Consequently, mechanical and electrical modules of the SEM need to be adapted to the higher cleanliness requirements of today.

The trivial approach for achieving high levels of cleanliness is keeping whatever possible outside of the vacuum and improving the cleanliness of the components inside the vacuum. In order to reduce the contaminants contributed by the stage structure, according to certain approaches, the motors and sensors are placed outside of the vacuum chamber and only the slides and rails are placed inside of the vacuum chamber. This approach is relatively easy to implement for a one axis stage structure, or where low position accuracy is sufficient. Another approach utilizes a one axis stage structure with magnetic coupling: Two stage structures are built, one in the vacuum (the vacuum stage structure), without motor and cables, and another stage structure, with magnet load, is built in parallel outside of the vacuum (the atmospheric stage structure) and is magnetically coupled with the vacuum stage structure. In operation, the controlled atmospheric stage structure runs, and the vacuum stage structure tracks its motion by means of the magnetic coupling. Yet another approach makes use of a two axis stage structure having rotary motors located outside of the vacuum chamber and a mechanical gear drive passing the motion for the lower and upper axis.

Furthermore, equipment vendors use vacuum rated modules, made of allowed materials, e.g., low outgassing materials, and continuously develop, improved cleanliness components and cleanliness processes (e.g., cleaning by temperature bake out). An example of high cleanliness cable components are PTFE high cleanliness cables commercially available from Gore™. It should be noted that, as the sensitivity to cleanliness is increasing, the testing capability of outgassing characteristics of materials or modules is limited. It might therefore be difficult to measure the level of cleanliness of a module (e.g., the amount of contaminants outgassed from the module) and evaluate its compatibility with the cleanliness requirements of sensitive processes.

SUMMARY OF THE INVENTION

The inventor has recognized a need to provide vacuum chambers with low level of contaminants due to molecule outgassing and is need for tool components, mechanical and electrical modules, and module materials, specifically stage structures, which can satisfy these high cleanliness demands. Accordingly, an embodiment of the invention provides an improved stage structure designed to operate in a vacuum environment. The stage structure includes a first low-outgassing plate; and first high-outgassing associated components that are encapsulated by first low-outgassing covering elements; wherein the first low-outgassing plate is arranged to be coupled to a first motor that is arranged to move the first low-outgassing plate along a first direction; wherein an outgassing level of, each of the first low-outgassing plate and the first low-outgassing covering elements does not exceed a tolerable level of outgassing in the vacuum environment and wherein an outgassing level of each first high-outgassing associated component is above the tolerable level of outgassing in the vacuum environment.

The first motor may include a low-outgassing magnet channel and high-outgassing coils that are proximate to the magnet channel, wherein the high-outgassing coils are encapsulated, by a coils low-outgassing enclosure.

The coil low-outgassing enclosure may include an output port; and the stage structure may include a low-outgassing tube; wherein the low-outgassing tube enters the coils low-outgassing enclosure via the output port and wherein at least one high-outgassing cable for conveying control signals to the first motor is enclosed by the low-outgassing tube.

The high-outgassing coils may be connected to a coils frame without the use of high-outgassing adhesive materials. The coils frame may be made of a high-outgassing material.

The first high-outgassing associated components may include first high-outgassing cables that are encapsulated by a first set of low-outgassing flexible bellows.

The stage structure may include a first low-outgassing cooling element. The first low-outgassing plate may be coupled to a first low-outgassing slide that is movable along a first low-outgassing rail. The first low-outgassing rail may be lubricated with a lubricant. The level of outgassing of the lubricant may increase when the lubricant is heated (for example—due to fraction). The first low-outgassing cooling element may be coupled to the first low-outgassing slide and may be arranged to cool the lubricant.

The first low-outgassing cooling element may be provided with a cooling liquid that is provided via a high-outgassing fluid tube that is encapsulated by a low-outgassing flexible bellows.

The first low-outgassing cooling element may have an outer portion and an inner portion. The inner portion may be arranged to enclose the first low-outgassing rail while leaving at least one gap between the inner portion and the first low-outgassing rail. The gap(s) can trap gas that is outgassed from the lubricant. The gap(s) may not reach the outer portion and therefore may form an inner gap that is not viewed from the exterior of the low-outgassing cooling element.

The stage structure may include a high-outgassing encoder that has a read head that is enclosed by a low-outgassing encoder enclosure. The low outgassing encoder enclosure may include a window that allows the read head to read a first low-outgassing scale.

The stage structure may further include a second low-outgassing plate and second high-outgassing associated components that are encapsulated by second low-outgassing covering elements. The second low-outgassing plate is arranged to be coupled to a second motor that is arranged to move the second low-outgassing plate along a second direction that differs from the first direction. The outgassing level of the second low-outgassing plate does not exceed the tolerable level of outgassing in the vacuum environment.

The first low-outgassing plate may be connected to a first low-outgassing junction box and the second low-outgassing plate may be connected to a second low-outgassing junction box, the first low-outgassing junction box may be connected to a first set of low-outgassing flexible bellows, and a second set of low-outgassing flexible bellows may, be connected between the first low-outgassing junction box and the second low-outgassing junction box.

The first low-outgassing junction box may include a first set of ports connected to the first set of low-outgassing flexible bellows, a second set of ports connected to the second set of low-outgassing bellows, and a third set of ports connected to low-outgassing tubes that encapsulate cables that provide signals to an associated component that is coupled to the first low-outgassing plate; wherein the first low-outgassing enclosure encloses a first high-outgassing encoder arranged to detect a location of the first low-outgassing plate and encloses high-outgassing cables that are connected to components that are coupled to the first low-outgassing plate.

The first set of low-outgassing flexible bellows may be coupled to a pumping system located outside the vacuum environment, for pumping gas from an interior space of the first set of low-outgassing flexible bellows.

The second low-outgassing enclosure may be connected to second rigid low-outgassing connectors that enclose high-outgassing cables to components that are connected to the second low-outgassing plate.

The first low-outgassing covering elements may include a first set of low-outgassing flexible bellows arranged to move along the first direction and along an opposite first direction. The second low-outgassing covering elements may include a second set of low-outgassing flexible bellows arranged to move along the second direction and along an opposite second direction.

The first set of low-outgassing flexible bellows may be coupled to a pumping system located outside the vacuumed environment, for pumping gas from an interior space of the first set of low-outgassing flexible bellows.

The stage structure may further include at least one additional low-outgassing plate movable along at least one additional direction.

A further embodiment of the invention provides a method for moving an inspected object within a vacuum environment. The method may include: (i) supporting the inspected object by a low-outgassing chuck that is connected to a low-outgassing plate; (ii) moving the low-outgassing plate along a direction by a motor, and (iii) executing at least one additional operation that is related to the moving and differs from the supporting. At least one out of the moving and the additional operation is executed by at least one high-outgassing associated component that is encapsulated by at least one low-outgassing covering elements. An outgassing level of each of the low-outgassing plate, the low-outgassing chuck and the at least one low-outgassing covering element does not exceed a tolerable level of outgassing in the vacuum environment. An outgassing level of each of the at least one high-outgassing associated component is above the tolerable level of outgassing in the vacuum environment.

The at least one additional operation may be monitoring the moving, initiating the moving, and, additionally or alternatively, moving another low-outgassing plate along another direction, wherein the moving of the other low-outgassing plate affects a position of the inspected object.

BRIEF DESCRIPTION OF THE DRAWINGS

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

FIG. 1 shows a system according to an embodiment of the invention.

DETAILED DESCRIPTION

Figure 2:
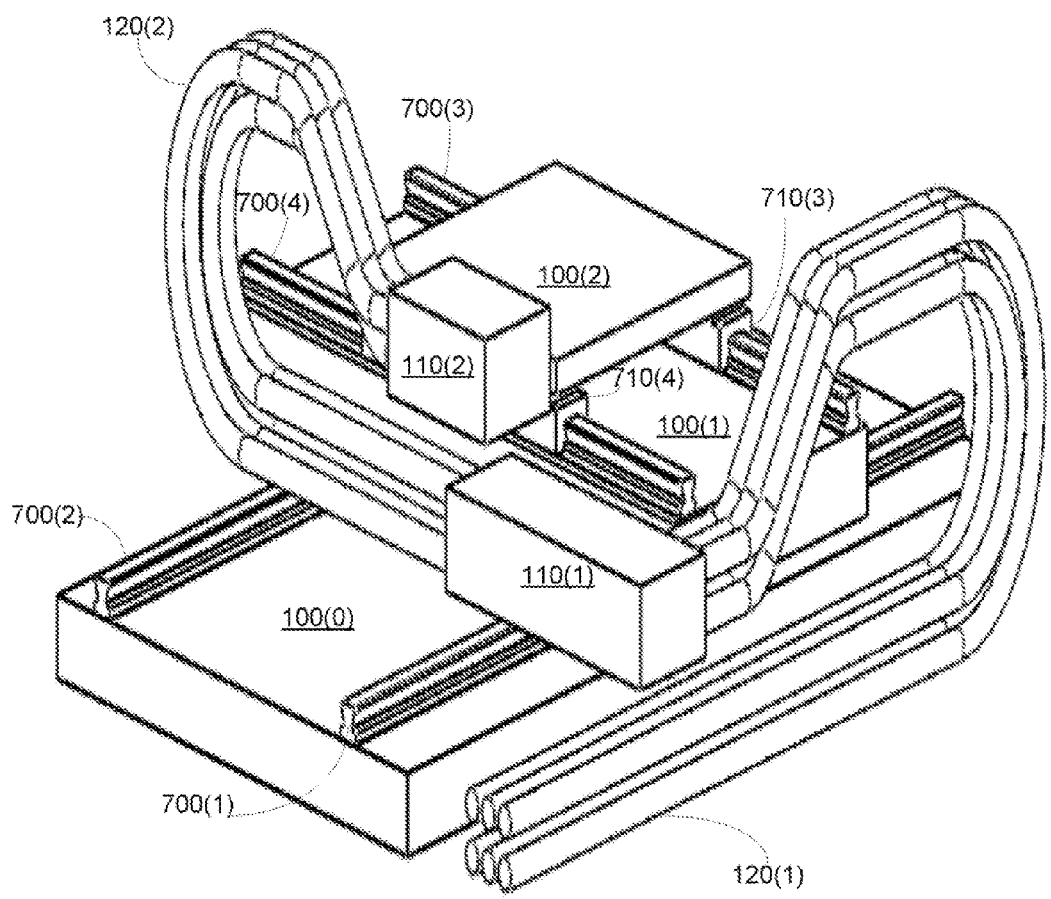
FIG. 2 is a perspective view of a stage structure and transverse motion cable routing according to an embodiment of the invention.

In the following description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The term "low-outgassing" refers to a level of outgassing that does not exceed a tolerable level of outgassing in a vacuum environment (or an environment to be, subjected to vacuum). The term "high-outgassing" refers to an outgassing level that is intolerable—i.e., is above the tolerable level of outgassing in the vacuum environment. The tolerable level of outgassing in the vacuum environment (e.g., a vacuum chamber of a semiconductor processing apparatus or inspection apparatus) may be defined by an industry or other standard (such as an international standard) or may be determined by a person such as but not limited to an operator of the stage structure or the apparatus in which it is deployed, an owner or manufacturer of an inspected object that should be inspected while in the vacuum chamber, and the like. The tolerable level is usually known at the design stage or the manufacturing stage of the stage structure.

The phrase "and/or" means additionally or alternatively.

The term "associated component" refers to a component that is located within a vacuum environment, differs from a low-outgassing plate and can satisfy at least one of the following criteria: (i) it is connected (directly or indirectly) to the low-outgassing plate, (ii) is can affect and/or effect a movement and/or location of the low-outgassing plate, (ii) it monitors the movement and/or location of the low-outgassing plate, (iii) it supplies signals and/or receives signals from the low-outgassing plate, (iv) it supplies signals and/or receives signals from another associated component, (v) it supplies fluids and/or receives fluids from the low-outgassing plate, (iv) it supplies fluids and/or receives fluids from another associated component.

According to an embodiment of the invention, there is provided a stage structure for use in high vacuum, comprising at least a low-outgassing plate (that is, a plate made of a low-outgassing material) and associated components made of high-outgassing materials, wherein part or all of the associated components made of high-outgassing materials are encapsulated by a covering structure or a covering layer made of a low-outgassing material. For example, if such associated components made of high-outgassing materials are cables, the cables are placed within bellows made of a low-outgassing material. Alternatively, cables having an outer jacket made of a high outgassing material may be used. Following another example, components such as junction boxes, linear motors, linear encoders and conductor connectors are encapsulated by the covering structure or covering layer. The same is applicable for stage structures having also a second-direction axis or a second-direction axis and a third-direction axis.

According to another embodiment of the invention, there is provided a stage structure for use in high vacuum, comprising at least a one-direction plate made of a low-outgassing material and associated rails and slides, wherein at least the rails or the slides are lubricated with a lubricant, the stage structure further comprising a cooling system that includes at least a cooling plate made of a low-outgassing material, coupled to the slides and coupled to a cooling source, thereby pumping molecules outgassed from the lubricant in response to mechanical bearing movements. A one-direction plate may move in a single direction (and the opposite direction, i.e., along a single axis) once the installation of the stage structure is completed.

High position accuracy motion systems such as those used for the manufacturing and inspection of semiconductor devices require a stage structure placed within the vacuum chamber for moving the devices (e.g., constituting a wafer). According to an embodiment of the invention, certain stage structure components and modules are enclosed or packaged in sealed enclosures made of allowed materials (e.g., low outgassing materials). The sealing is provided with respect to the vacuum environment, while connection with the atmospheric environment is maintained. Thus, certain stage structure components and modules which are located inside of the vacuum chamber are separated into a different environment within the vacuum chamber. This different environment is separated from the rest of the vacuum chamber by implementing sealing. As required, continuous pumping is applied to the separated environment by dedicated pumps. According to another embodiment of the invention, certain stage structure modules and components are cooled by a dedicated cooling system located inside of the vacuum environment. According to yet another embodiment of the invention, common enclosures (packages) are used for hosting both stage structure components to be separated from the vacuum environment as well as elements of the cooling system (e.g., tubes, fittings, etc.).

FIG. 1 illustrates system 10 according to an embodiment of the invention. System 10 may be an inspection system, a metrology system, and the like.

System 10 includes a vacuum chamber 80 in which a vacuum environment is maintained. The vacuum chamber 80 can be pumped by one or more vacuum pumps such as vacuum pump 88. A stage structure 90 is located in the vacuum chamber 80.

The stage structure 90 may include at least some of the following components:
 a. First low-outgassing plate 100(1),
 b. Second low-outgassing plate 100(2),
 c. Low-outgassing base plate 100(0), this low-outgassing base plate can be stationary while the first and second low-outgassing plates 100(1) and 100(2) move in relation to the low-outgassing base plate 100(0);
 d. First high-outgassing associated components 102(1) that are encapsulated by first low-outgassing covering elements 104(1); and
 e. Second high-outgassing associated components 102(2) that are encapsulated by second low-outgassing covering elements 104(2).

The first high-outgassing associated components 102(1) may include at least some of the following components:
 a. First motor 30 or a portion thereof (such as high-outgassing coils 400 and coils frame 405) wherein first motor 30 is arranged to move the first low-outgassing plate 100(1) along a first direction, b. High-outgassing cables (such as cables 935, 330 and 532) that may convey signals to and/or from various components of the system;
c. High-outgassing coils 400,
d. High-outgassing coils frame 405,
e. High-outgassing encoder read head 505,
f. High-outgassing cables 935, and
g. High-outgassing water tubes 930.

The second high-outgassing associated components 102(2) may include at least some of the following components:
 a. Second motor 30(2) or a portion thereof (such as high-outgassing coils and a coils frame) wherein the second first motor 30(2) is arranged to move the second low-outgassing plate 100(2) along a second direction,
 b. High-outgassing cables 330(2), 520(2), 935(2) that may convey signals to and/or from various components of the system,
 c. High-outgassing coils 400(2),
 d. High-outgassing coils frame 405(2),
 e. High-outgassing encoder read head 505(2), and
 f. High-outgassing water tubes 930(2).

The first low-outgassing covering elements 104(1) may include at least one of the following:
 a. First set of low-outgassing bellows 120(1),
 b. Rigid sealed tubes 130(1),
 c. First junction box 110(1),
 d. First motor coil enclosure 310,
 e. First encoder enclosure 500,
 f. Low-outgassing fluid junction box 940, and
 g. Set of low-outgassing bellows 920.

The second low-outgassing covering elements 104(2) may include at least one of the following:
 a. Second set of low-outgassing bellows 120(2),
 b. Rigid sealed tubes 130(2),
 c. Second junction box 110(2),
 d. Second motor coil enclosure 310(2),
 e. Second encoder enclosure 500(2).

The system 10 may also include one or more associated low-outgassing associated components such as:
 a. First low-outgassing rail 700(1),
 b. Second low-outgassing rail 700(2),
 c. Third low-outgassing rail 700(3),
 d. Fourth low-outgassing rail 700(4),
 e. First low-outgassing magnet channel 300,
 f. Second low-outgassing magnet channel 300(2),
 g. Low-outgassing chuck 620,
 h. First low-outgassing slide 710(1),
 i. Second low-outgassing slide 710(2),
 j. Third low-outgassing slide 710(3),
 k. Fourth low-outgassing slide 710(4), and
 l. A third enclosure 110(3).
 m. Low-outgassing cooling element 800.

Some of these components are illustrated in others of the figures.

In order to address cleanliness requirements, rigid sealed tubes are typically used in vacuum chambers. Semi rigid sealed tubes, such as PTFE, are also used. However, in order to provide a reliable transverse motion, the use of flexible tubes is required. By using metal flexible tubes (e.g., bellows) cleanliness requirements are met, reliable transverse motion is provided, and risk of failure (e.g., broken tubes) is reduced. In addition to system specifications, bellows characteristics (e.g., dimensions) and the required bending radius are considered in designing a specific solution. The tubes running inside the bellows are not limited regarding the material they are made of. There are no special cleanliness or vacuum requirements as they are separated from the clean environment, thus common tubes suitable for dynamic operation can be used. In case of failure, e.g., water leakage, the water will stay inside of the bellows sealed environment and will not reach the clean, vacuum environment.

Optionally, water leak detectors such as water leak detectors 750 are installed inside the bellows and/or the junction boxes, for detecting water leaking from the water tubes. In case of bellows failure, there will be a leak towards the vacuum chamber, and the vacuum system detectors 752 will detect it. The water leak detectors can be made of high-outgassing materials while the vacuum system detectors 752 should exhibit low-outgassing levels.

FIG. 2 illustrates schematically a stage structure 90 with low-outgassing slides (710(1)-710(4)) according to an embodiment of the invention, suitable to be placed within a vacuum chamber (denoted 80 in FIG. 1). These low-outgassing slides are linear but other shapes of low-outgassing slides may be used.

The low-outgassing base plate 100(0), and first and second low-outgassing plates 100(1) and 100(2) can be made of low-outgassing materials such as vacuum rated materials. These materials can include, for example, stainless steel, ceramics, aluminum or other allowed materials.

The stage structure 90 also includes a low-outgassing base plate 100(0) that is stationary. The first low-outgassing plate 100(1) is located between the low-outgassing base plate 100(0) and the second low-outgassing plate 100(2) and may serve as a base to the second low-outgassing plate 100(2).

First and second low-outgassing junction boxes 110(1) and 110(2) may include or encapsulate connectors, encoder amplifiers and additional associated components. It is noted that a low-outgassing junction box can have any shape or size and that a junction box can be used to enclose fluid conveying tubes or pipes and other high-outgassing elements such as high-outgassing signal conveying cables. Alternatively, separate junction boxes are used to enclose fluid conveying elements and separate junction boxes are used to convey electricity.

The stage structure 90 may include two sets of low-outgassing flexible metal tubes or low-outgassing bellows 120(1) and 120(2). These sets of low-outgassing bellows may be attached to the various low-outgassing plates (or to low-outgassing junction boxes) and facilitate transverse motion.

Each set of low-outgassing bellows may end in its upper end with a low-outgassing junction box. The first low-outgassing junction box 110(1) may be connected to the first set of low-outgassing bellows 120(1). The second low-outgassing junction box 110(2) may be connected to the first and to the second sets of low-outgassing bellows 120(1) and 120(2).

Each low-outgassing junction box 110(1) and 110(2) may have several roles:
 a. routing cables towards another set of low-outgassing bellows;
 b. enclosing high-outgassing associated components that should be placed adjacent to the low-outgassing plates, such as a high-outgassing encoder (and especially a high-outgassing encoder read-head amplifier); and/or
 c. as connectors or terminal blocks (not shown) for connecting the high-outgassing cables to various high-outgassing associated components, such as but not limited to high-outgassing coils.

According to an embodiment of the invention, the low-outgassing sets of bellows 120(1) and 120(2) are made of stainless steel. The low-outgassing junction boxes 110(1) and 110(2) may be made of vacuum rated material such as aluminum, and the sealing is done with vacuum highly clean seals.

A lower edge of the first set of low-outgassing bellows 120(1) may be connected to the vacuum chamber wall interface (denoted 88 in FIG. 1).

Each of set of low-outgassing bellows 120(1) and 120(2) may be manufactured to withstand vacuum in its exterior (in the vacuum environment), and atmospheric pressure in its interior. In order to eliminate forces working on the bellows due to pressure differences, the inside of each set of low-outgassing bellows can be pumped also, hence increasing the lifetime of the low-outgassing bellows. The low-outgassing sets of bellows, the low-outgassing junction boxes and the tubes running from those low-outgassing junction boxes are all sealed, having clean vacuum on the outside and different pressure on the inside.

According to an embodiment of the invention, illustrated in FIG. 2, tubes such as rigid sealed tubes 130(1) and 130(2) are routed from low-outgassing junction boxes 110(1) and 110(2) running towards the electrical modules attached to first and second low-outgassing plates 100(1) and 100(2).

According to an embodiment of the invention the rigid sealed tubes can be replaced by non-rigid tubes and could be made of flexible elements. It is noted that less strict limitations can be applied when selecting the materials of the tubes (in comparison to the materials of the first and second sets of flexible bellows) as these tubes are not expected to be bent or otherwise be forced to change their shape—thus they are less prone to outgas. Hence, they can be made of a material that is a higher outgassing level than the material of the flexible bellows.

According to an embodiment of the invention, the first and second sets of low-outgassing bellows 120(1) and 120(2) include low-outgassing flexible metal bellows that can operate in a transverse motion, having minimal load on the motion performance, and serve with long lifetime. Such bellows could be made of stainless steel, rated for vacuum with no compromises, and lead cable and tubes inside. Such bellows are commercially available from Witzenmann™, offering internal diameters (ID) of 13 mm, outer diameters (OD) of 19 mm, leak tested seals and a dynamic bending radius of ~100 mm. Cables suitable to be used with such bellows are, for example, round cables suitable for continuous transverse motion bending, commercially available from IGUS™.

According to the embodiment of the invention, high-outgassing cables are inserted into the hollow sets of low-outgassing bellows 120(1) and 120(2). According to another embodiment of the invention, the low-outgassing bellows may serve as the external cable grounded shield, instead of the standard shield. The sets of low-outgassing bellows 120(1) and 120(2) also protect these high-outgassing cables, so the standard protective layer can be eliminated. This way the high-outgassing cable can superbly fit into the bellows.

It should be noted that the low-outgassing bellows need not cover the high-outgassing cables for the entireties of their lengths. Thus according to an embodiment of the invention (not shown), only part of the high-outgassing cables is routed through the low-outgassing sets of bellows, having electrical feed-throughs that seal the low vacuum environment, and having additional high-outgassing cables from the feed-through towards the end module.

Figure 4:
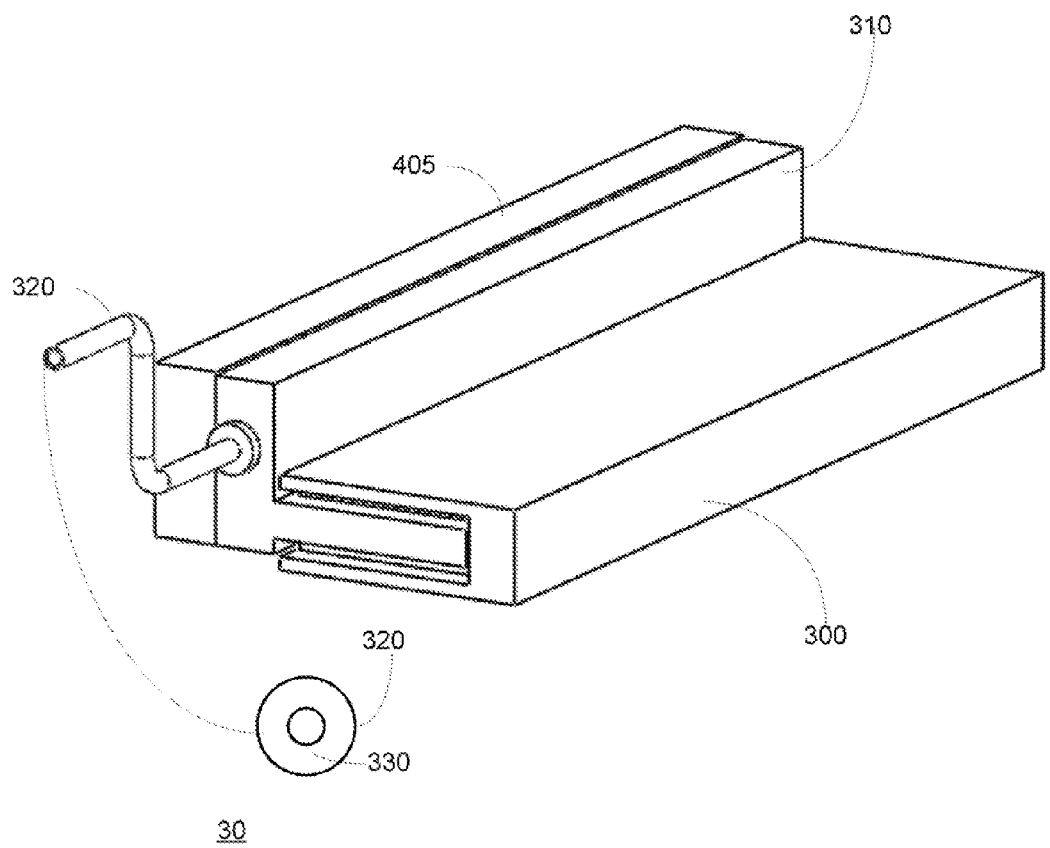
FIG. 4 illustrates a linear motor forming a part of a stage structure according to an embodiment of the invention.
Figure 5:
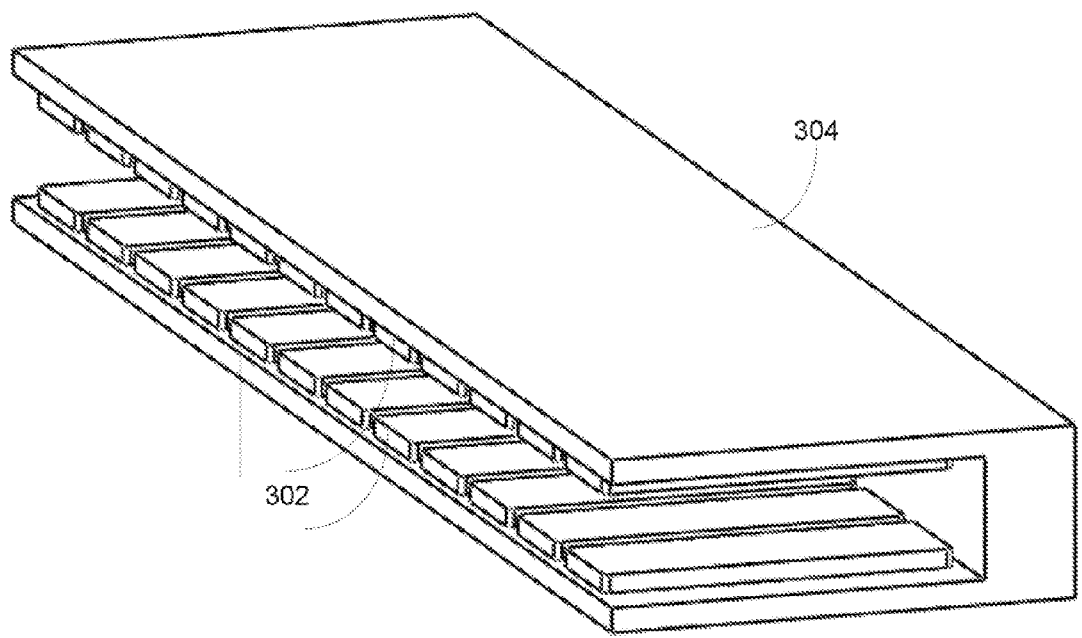
FIG. 5 illustrates a magnet channel of the linear motor of FIG. 4 according to an embodiment of the invention.
Figure 6:
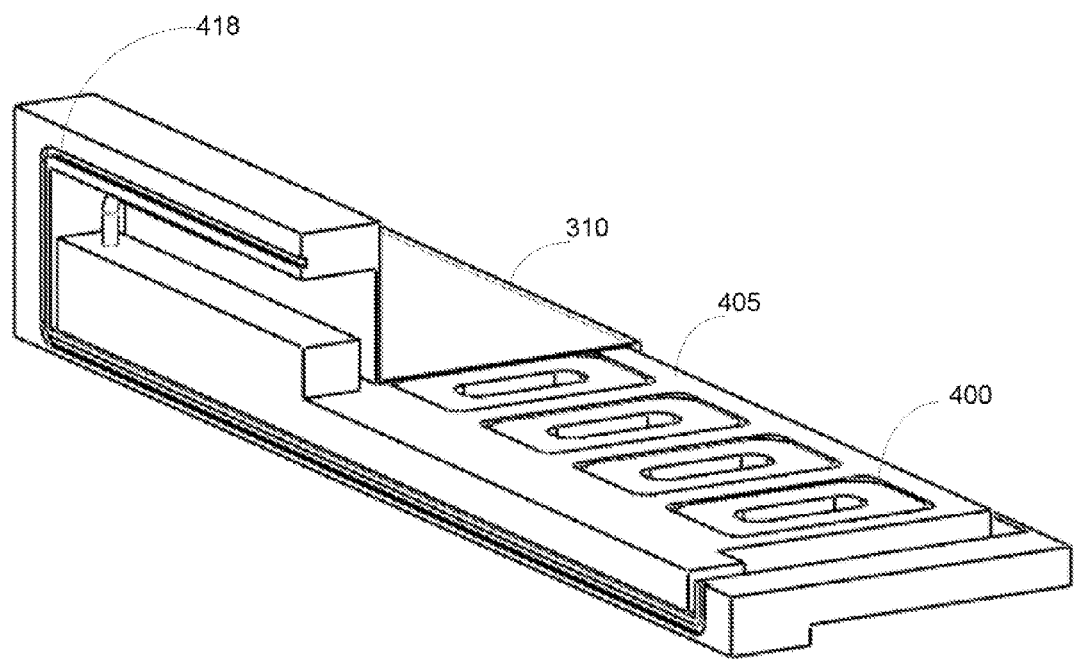
FIG. 6 shows a cross section of a linear motor coil of the motor illustrated in FIG. 4.

FIG. 4 schematically illustrates a first motor 30 which is a component of a stage structure e.g., stage structure 90 shown in FIG. 2, and is located within the vacuum chamber 80. FIG. 5 schematically illustrates a magnet channel 300 of the first motor 30. FIG. 6 illustrates a cross section of a coils module 40 of the first motor 30.

The first motor 30 is a linear motor and includes a magnet channel 300, usually a static plate, and a coils module (denoted 40 in FIG. 6) that includes a coils low-outgassing enclosure 310. The magnet channel 300 can be made of low-outgassing materials and thus does not need to be enclosed by a low-outgassing enclosure. Alternatively, the magnet channel 300 may exhibit a high-outgassing level and may be enclosed by a low-outgassing enclosure.

The coils module 40 includes high-outgassing coils 400 and a coils frame 405. The coils frame 405 may be connected to a coils cable 330 that is routed toward a first motor power supply (not shown). The coils cable 330 can be enclosed within rigid sealed coils tube 320.

The coils low-outgassing enclosure 310 encloses the high-outgassing coils 400 and the coils frame 405. The coils frame 450 can be made of a high-outgassing material.

The coils low-outgassing enclosure 310 may be designed such that it will not interfere with the operation of the first motor 30. Proper low-outgassing materials may be applied, such as ceramics. The coils module 40 of the first motor 30 may be connected to the first low-outgassing plate 100(1) with a dedicated part referred to as connecting element 350. The connecting element 350 may serve as a sealed wall for the coils low-outgassing enclosure 310. The connecting element 350 may include cooling fluid tubes (not shown) that are formed within the connecting element 350 and may cool it.

It is noted that the high-outgassing coils 400 can be connected to the coils frame 405 by a high-outgassing adhesive that can be of a compromise material.

A cavity 418 can be formed in the coils low-outgassing enclosure 310 for allowing the inclusion of a sealing element such as an O-ring.

Figure 7:
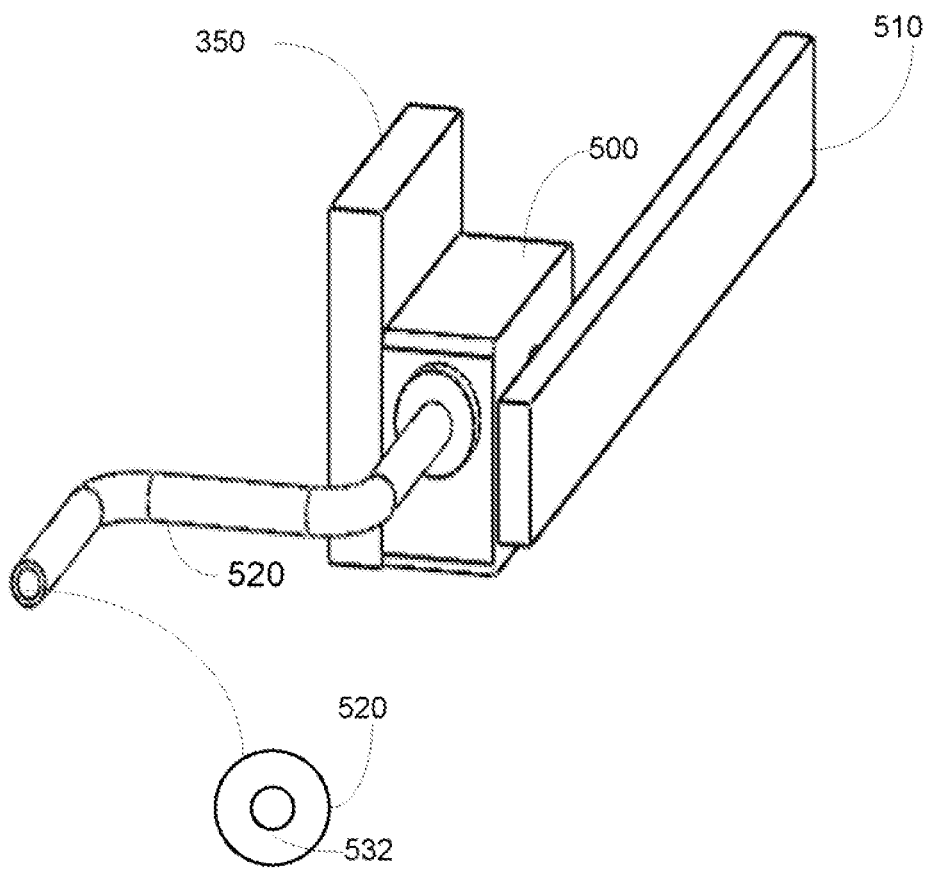
FIGS. 7-9 show aspects of a linear encoder head forming part of a stage structure according to an embodiment of the invention.
Figure 8:
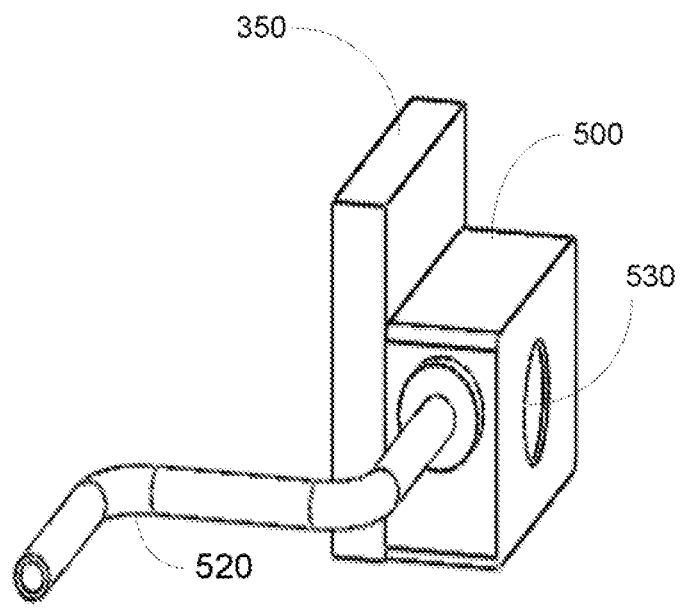
Figure 9:
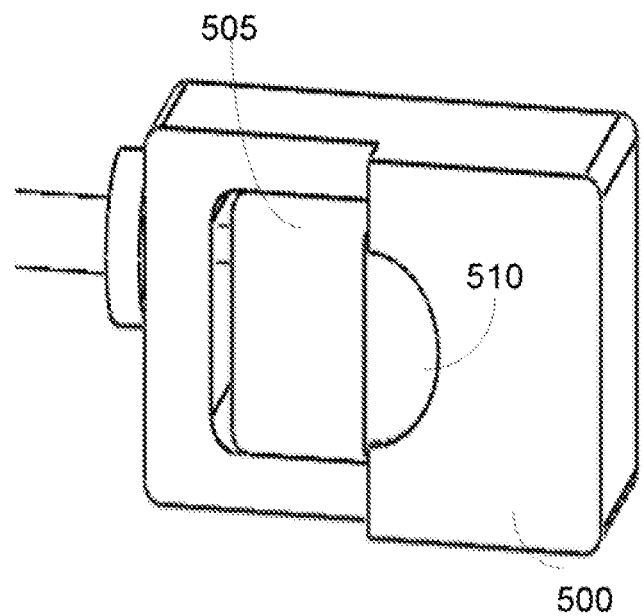

FIGS. 7-9 show a high-outgassing encoder read head 505 and a low-outgassing encoder read head enclosure 500. The high-outgassing read head 505 belongs to a high outgassing encoder read head 505 that also includes a low-outgassing scale 510. The high-outgassing encoder read-head 505 is enclosed by a low-outgassing encoder enclosure 500. The low-outgassing scale 510 can be linear and is often made of glass or Zerodure, with grades deposited on, and considered clean environment compatible.

The high-outgassing encoder read-head 505 has electronic components inside, and exhibits a cleanliness (outgassing level) that may be questionable. High resolution encoders have amplifiers that must be close to the read-head. They are often located on the low-outgassing plates (100(1) and 100(2)), and move together with the high-outgassing encoder read-head 505. The low-outgassing encoder enclosure 500 may include a transparent low-outgassing window 530 that faces the high-outgassing encoder read-head 505. Thus, the transparent low-outgassing window 530 enables the high-outgassing encoder read-head 505 to detect the encoded drags on the low-outgassing scale 510.

It is noted that other types of encoders can be used. For example, the stage structure may have a read head that reads a through-beam that passes through the low-outgassing scale 310. A similar enclosure with transparent windows may be applied, with attention to the optical characteristics of the window.

The high-outgassing encoder read-head 505 is connected to a high-outgassing cable 532 that is enclosed by a low-outgassing tube 520. The high-outgassing cable 532 can connect the high-outgassing encoder read head 505 to an amplifier that is located in the first or second low-outgassing junction boxes 110(1) and 110(2).

Figure 10:
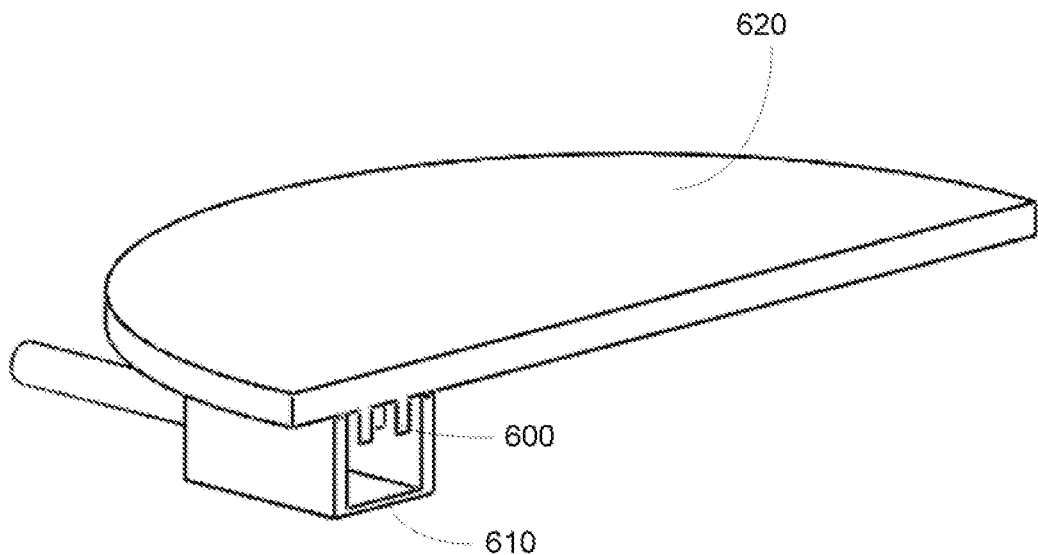
FIGS. 10-12 illustrate portions of an electrostatic chuck and other components of a stage structure according to certain embodiments of the invention.
Figure 11:
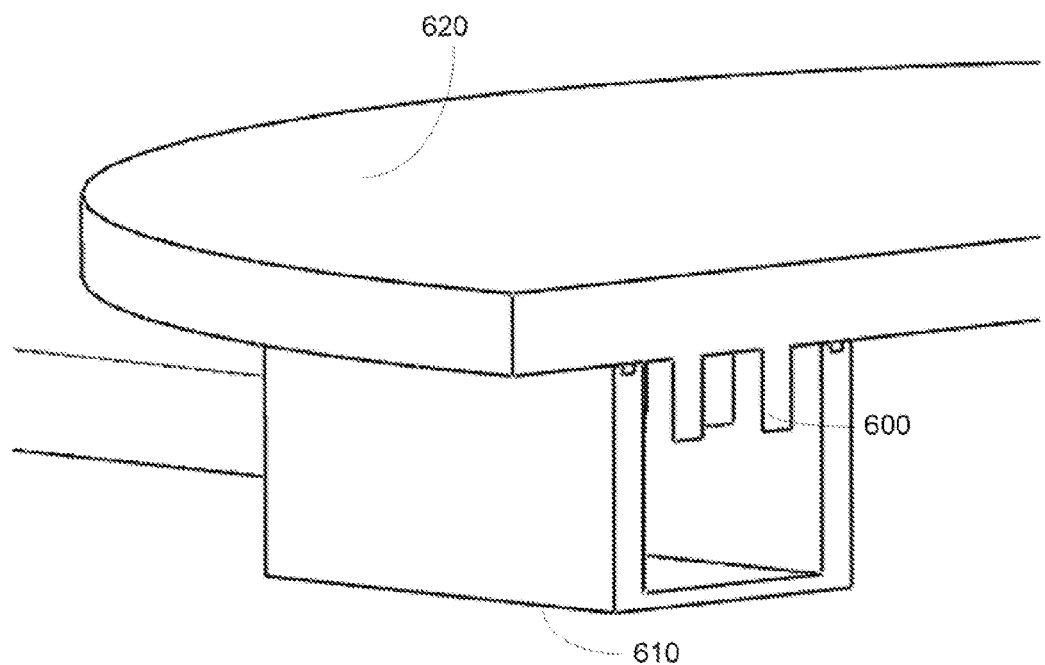
Figure 12:
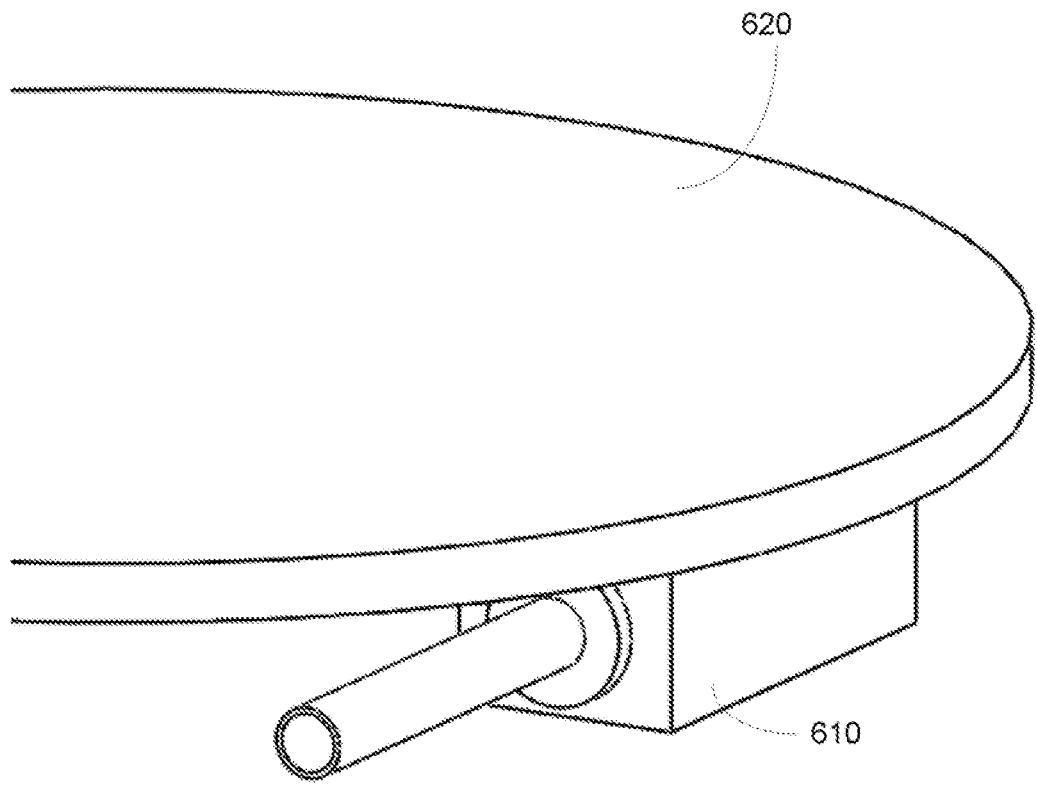

FIGS. 10-12 schematically illustrate, in a self explanatory manner, other components of the stage structure—low-outgassing chuck 620 and some associated components which, according to certain embodiments of the invention are packed in sealed chuck enclosure 610, such as chuck electrical connections 600 and additional cables 630. The low-outgassing chuck can be an electrostatic chuck that receives electrical signals and, additionally or alternatively, vacuum, via one of more tubes that are connected to the a lower surface of the low-outgassing chuck 620 via the connections 600 that are enclosed in the sealed chuck enclosure 610.

A lubricant is essential for mechanical bearing. There are available lubricants for clean vacuum, with very low vapor pressure in room temperature. Static tests performed with appropriate lubricants showed no effect on sensitive wafer manufacturing layers. However, as the stage structure moves, the mechanical bearing movement changes the lubricant characteristics, and molecules with higher vapor pressures are outgassed. It is assumed that a part of the lubricant is damaged, and the damaged part of the lubricant causes the cleanliness degradation. The lubricant is built of heavy molecules that have low vapor pressure. The damaged molecules are less heavy, with higher vapor pressure.

Figure 13:
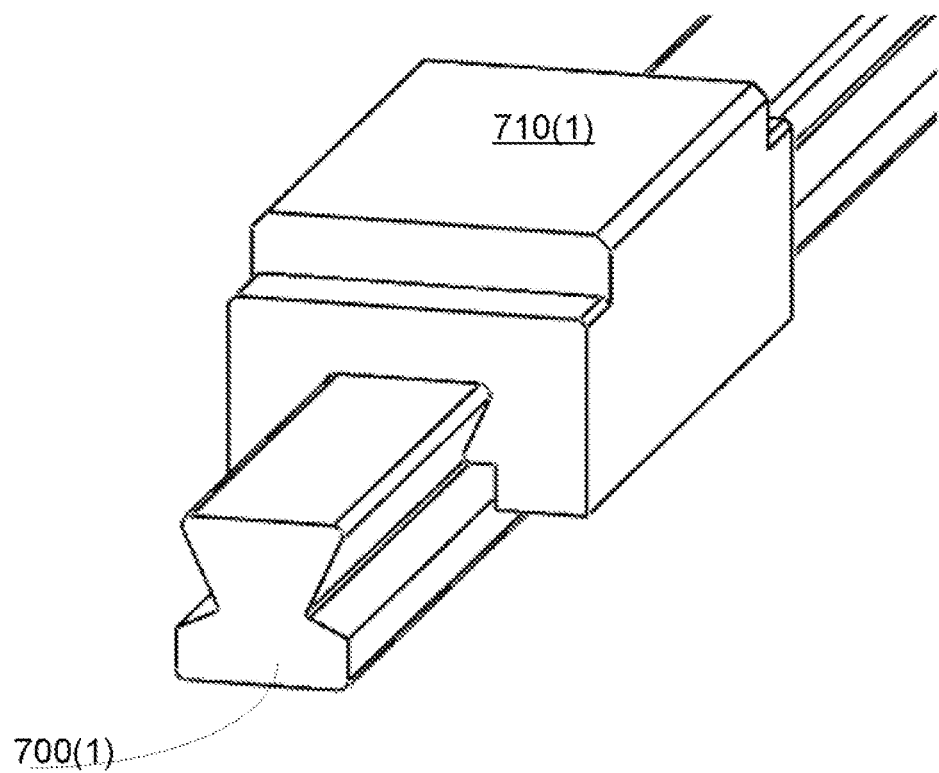
FIG. 13 illustrates an example of a linear bearing.

FIG. 13 shows a typical linear bearing 70, built from a first low-outgassing rail 700(1) and a first low-outgassing slide 710(1). The first low-outgassing slide 710(1) has usually internal rolling device as balls or rollers (not shown). The geometry differs for different characteristics, application and companies. The first low-outgassing rail 700(1) is usually lubricated all over the exposed surfaces (lubricant not shown), or on, the path were the side touched the rail.

As the first low-outgassing slide 710(1) moves along the first low-outgassing rail 700(1), there is interaction between the lubricant and the internal parts of the first low-outgassing slide 710(1). This interaction is usually the main purpose of applying the lubricant. The lubricant reduces the friction between the parts, and transfers heat. It is well seen, after sometime of operation, that the lubricant changes its color on the path where the slide touches the rail. This shows that the lubricant is damaged where it interacts with the slide. The damaged molecules are ejected from the first low-outgassing slide 710(1) into the vacuum environment through the openings between the slide and the rail (not shown).

Figure 14:
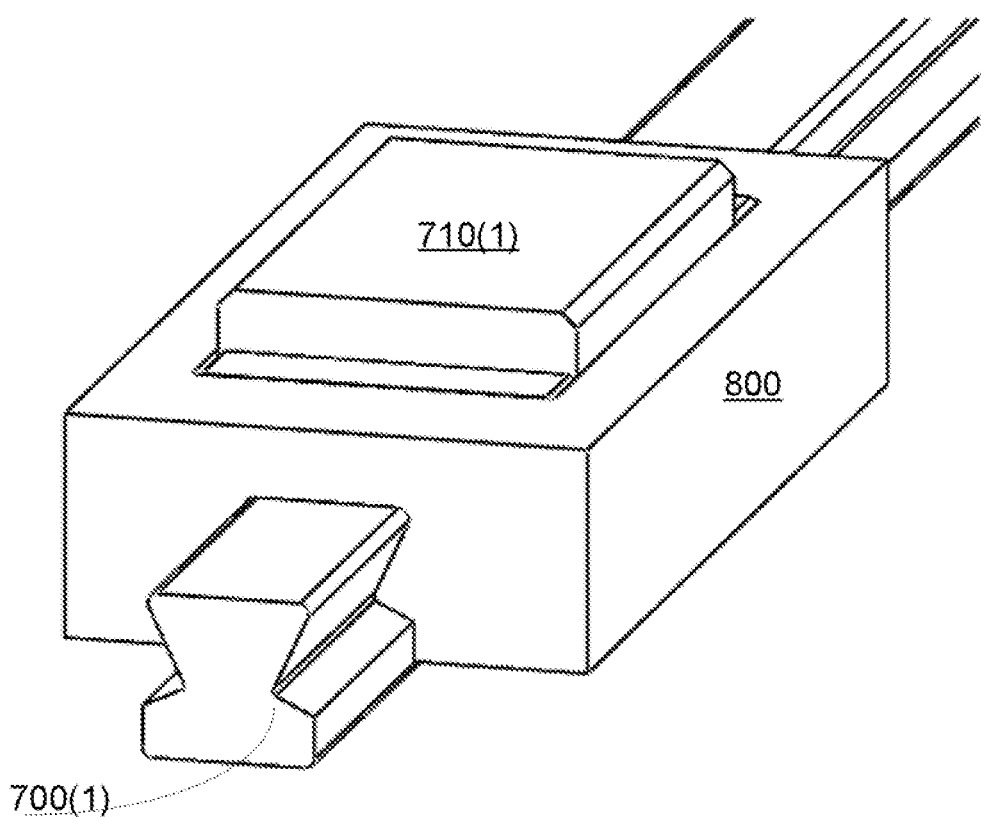
FIGS. 14-16 show aspects of a cooling system forming part of a stage structure according to an embodiment of the invention.
Figure 15:
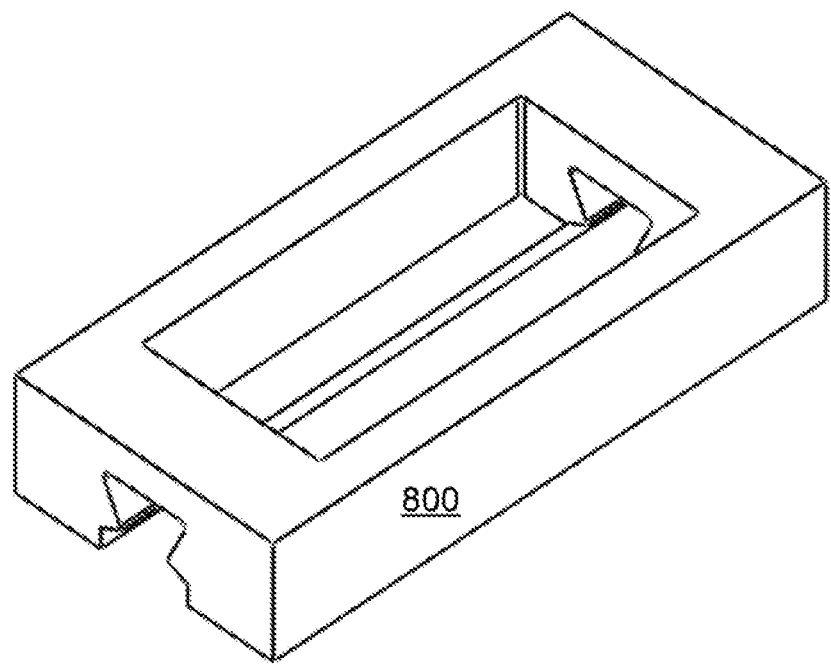
Figure 16:
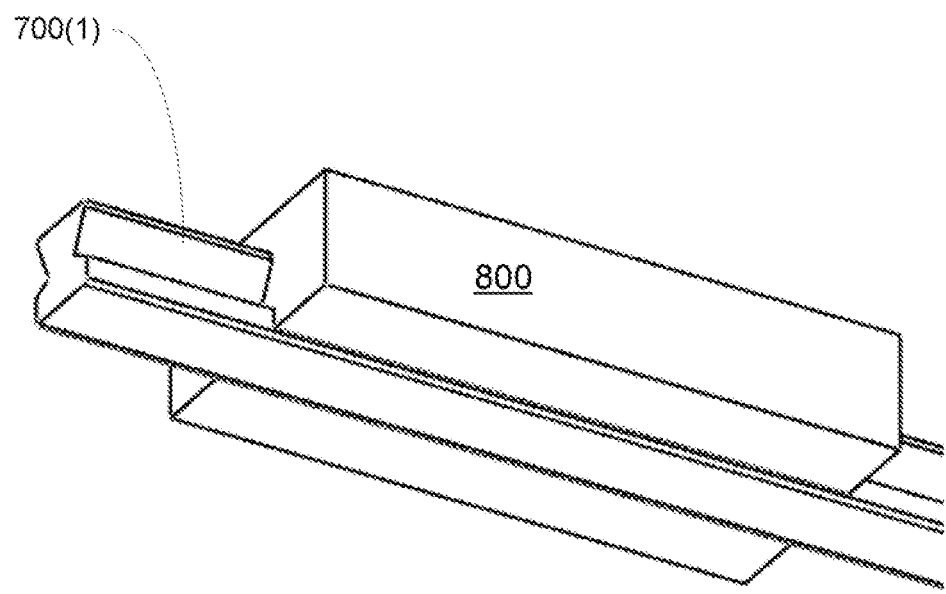

According to an embodiment of the invention, illustrated in part in FIGS. 14 and 15, a cooling element 800 is placed to partially surround the first low-outgassing slide 710(1), for capturing molecules that hit the cooling element. The cooling element 800 may be thermally isolated from the first low-outgassing slide 710(1), but capable of moving with it. The inner portion of the cooling element 800 may be shaped to form small gaps between the first low-outgassing slide 710(1) and the cooling element. These one or more gaps may serve as a trap for the molecules. The capture characteristics depend on the molecule vapor pressure and the surface temperature. Since the damaged molecules are relatively heavy, the temperature of the cooling element 800 can be in a range of temperature below and close to 0° C. This kind of cold surface will not pump other gases such as Nitrogen or Oxygen. Since the damaged molecules are ejected from openings of the first low-outgassing slide 710(1), the cold surface trap will cover those locations. Thus the molecules are captured close to their source, and do not reach the clean vacuum environment. For achieving up to −20° C., cooling water is used. Below −20° C., additional means such as water cooled TEC (Thermo Electric Cooler) devices are used and can be installed attached to the cold surface. The invention is not limited by the type of cooling method which is used, and any other liquid, gas or fluid can be applied in similar concept. FIG. 16 shows the cooling element 800 separated from the first low-outgassing slide 710(1) and the first low-outgassing rail 700(1). It can be seen that the shape is similar to the first low-outgassing slide 710(1) and the first low-outgassing rail 700(1) external contour, having small gap between them.

Applying water cooling for this kind of surface is not trivial, since the first low-outgassing slide 710(1) is moving, and the water tubes should reach it. The water tubes can run inside flexible metal bellows (120(1) and 120(2)), together with or instead of cables, and reach the cold components near the low-outgassing slides 710(1)-710(4). The cooling element 800 can be even sealed on one side, and have the water tubing connection in a different environment of the clean vacuum. In case Thermo Electrical Cooler is required, it can be attached to the cold surface, in a sealed enclosure.

Figure 17:
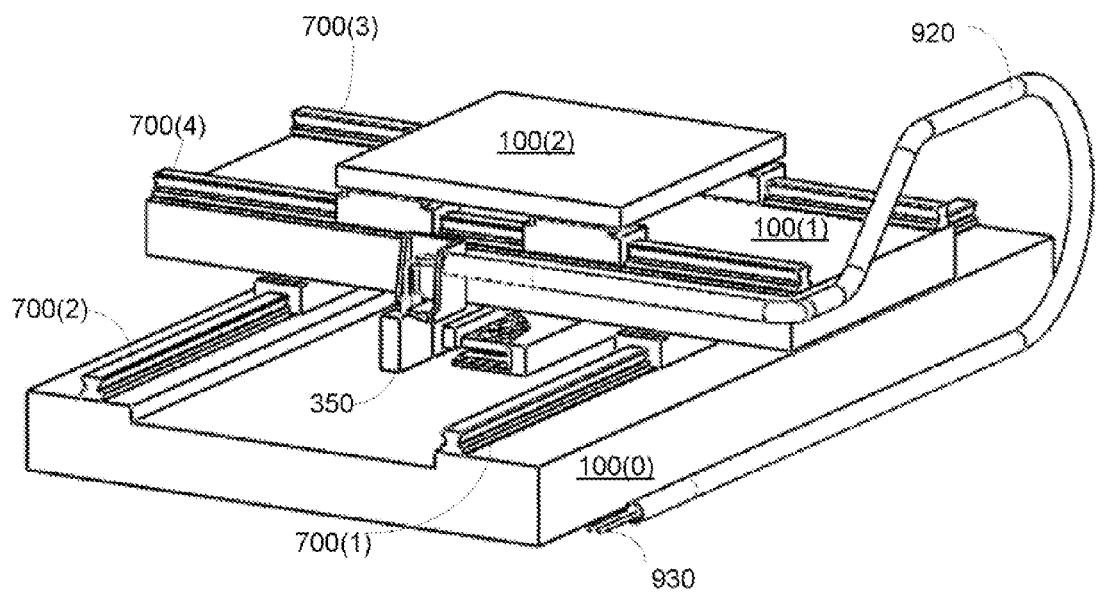
FIG. 17 shows an example of a stage structure and cooling system according to an embodiment of the invention.
Figure 18:
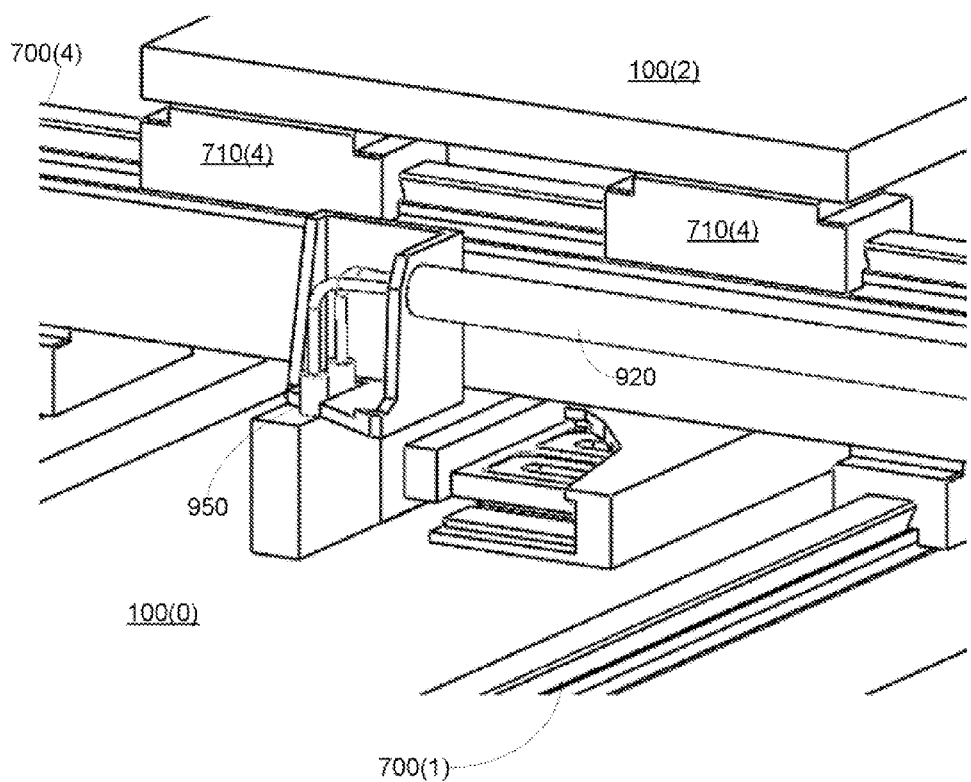
FIG. 18 shows in greater detail aspects of the cooling system illustrated in FIG. 17 according to an embodiment of the invention.

FIGS. 17 and 18 show a stage structure 92 in accordance with an embodiment of the invention, configured for implementing motor water cooling. In order to simplify explanations, cooling of only the lower axis is illustrated. As illustrated in a non limiting manner, there are provided a set of low-outgassing bellows 920 running from the low-outgassing base plate 100(0) towards the first low-outgassing plate 100(1) and especially towards a low-outgassing fluid junction box 940.

Figure 3:
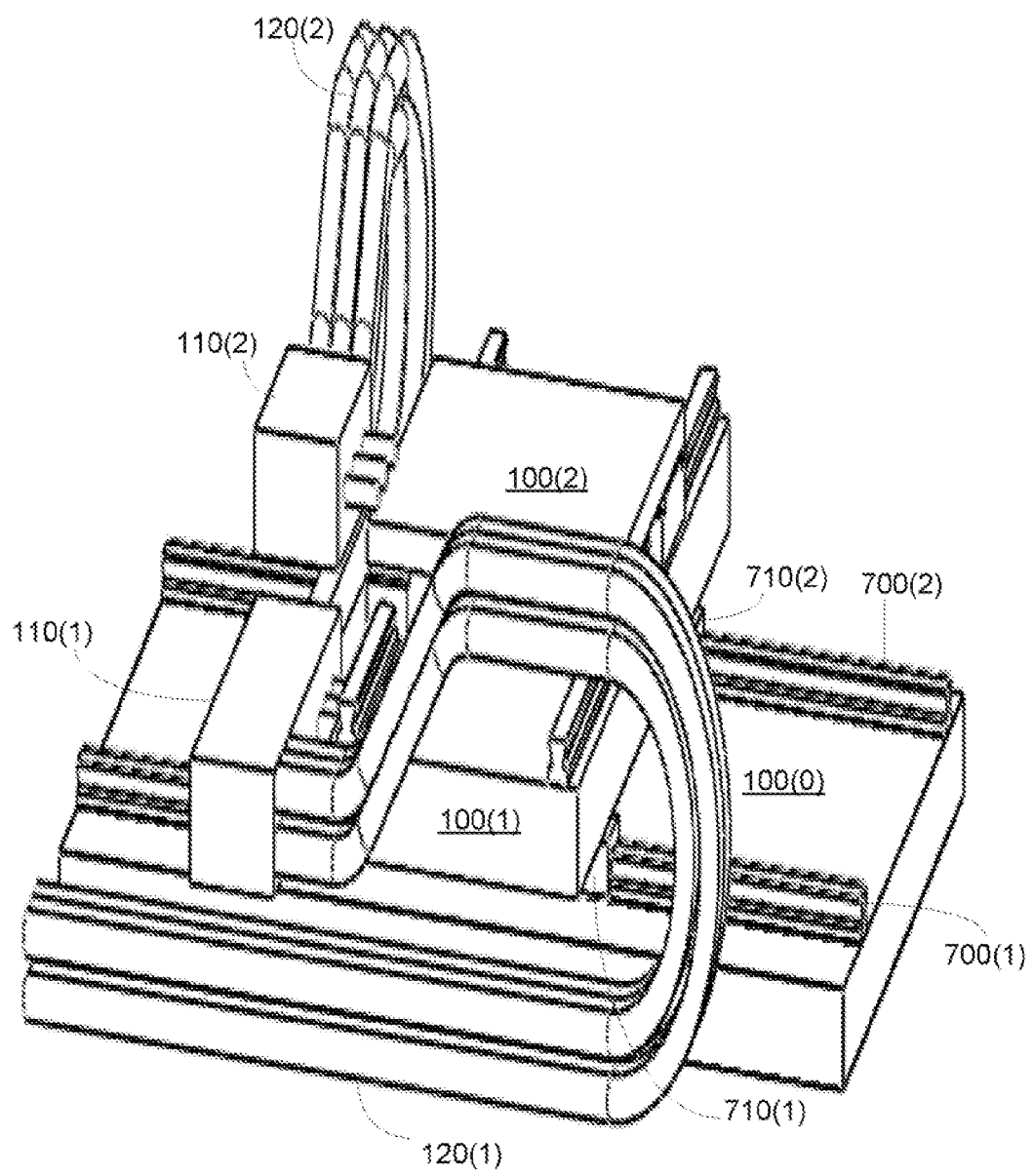
FIG. 3 shows a side view of a stage structure and transverse motion cable routing according to an embodiment of the invention.

The set of low-outgassing bellows 920 are carrying a coolant such as water that runs inside them (inside tubes 930) and reach the components to be cooled (e.g., low-outgassing coils frame 405 and coils 400, as illustrated in a non limiting manner) via the low-outgassing fluid junction box 940 and fittings 950. Cooling is achieved either by routing the tubes via cooling channels provided in the components to be cooled (direct cooling), or via an additional cooling element (not shown) thermally coupled to the components to be cooled. High-outgassing cables 935 (e.g., cables 330 illustrated in FIG. 3 or any other cables coupled to any stage structure components) can also be hosted by the set of low-outgassing bellows 920.

It is noted that the low-outgassing fluid junction box 940 can differ from the first low-outgassing junction box 110(1), may be integrated with the first low-outgassing junction box 110(1) or may be the same junction box.

It is further notes that the set of low-outgassing bellows 920 can differ from the first set of low-outgassing bellows 120(1) or can be the same.

It should be noted that the invention is not limited by the type and manner by which the required vacuum is applied. The invention was described mainly with semiconductor applications utilizing high vacuum, however the invention is not limited thereto and is applicable to any application that requires certain environmental separation between elements, such as an explosive sensitive environment, corrosive environment, or any chemically reactive environment.

The invention was described mainly with reference to round cables, bellows and tubes. It should be noted that the invention is not limited by the shape and type of the cables, bellows and tubes that are used. Furthermore, other flexible elements can be used without departing from the scope of the present invention, such as thin metal leads and optical fiber, or any other flexible materials.

For simplicity of explanation the invention was described with reference to an X-Y stage structure. The invention is not limited thereto and is applicable for additional axis such as a Z direction (i.e., a linear direction orthogonal to the other two directional axes) or a rotational axis, with the appropriate modifications and alterations.

Figure 19:
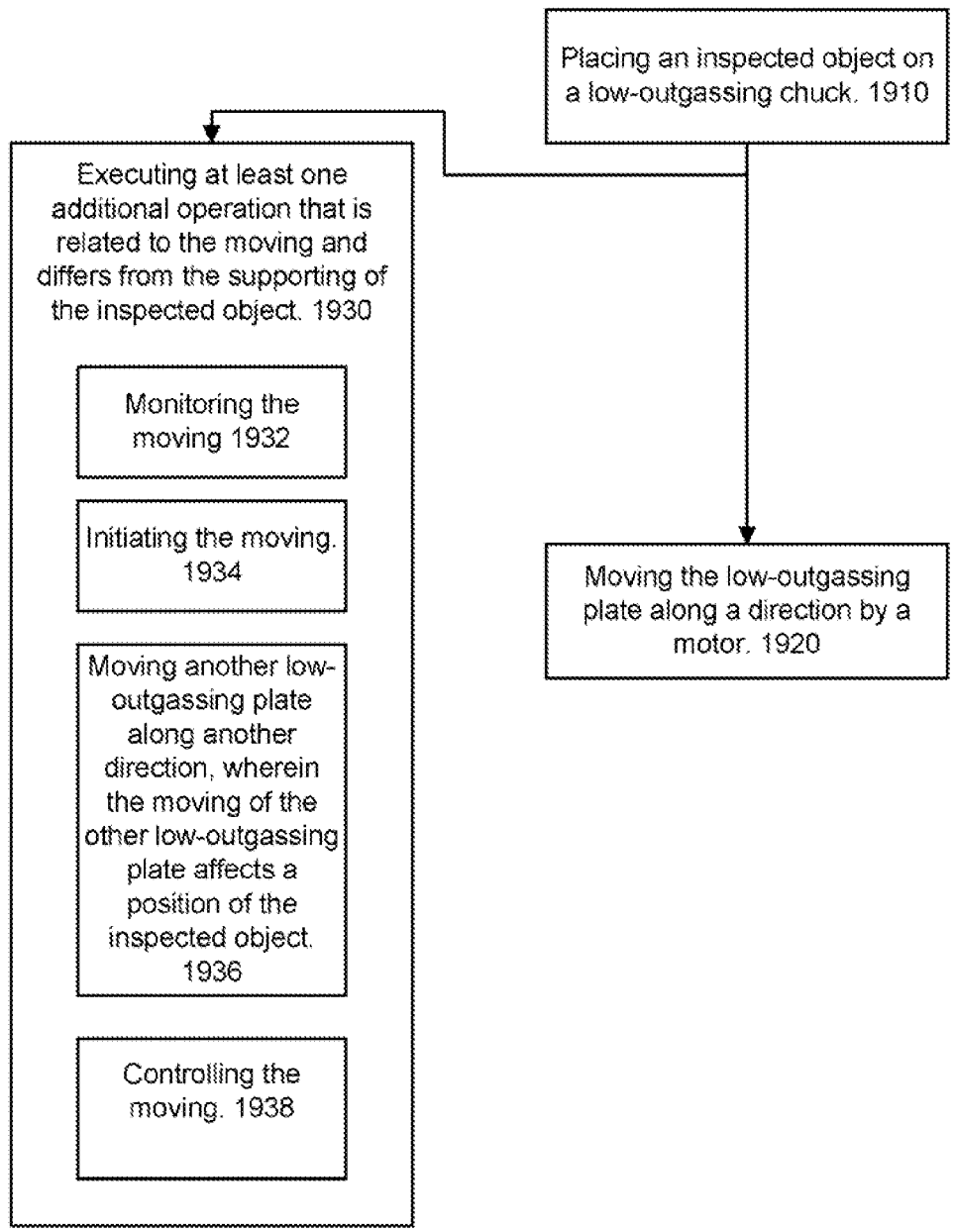
FIG. 19 illustrates a method for moving an inspected object within a vacuum environment according to an embodiment of the invention.

FIG. 19 illustrates method 1900 for moving an inspected object within a vacuum environment according to an embodiment of the invention.

Method 1900 starts by step 1910 of placing an inspected object on a low-outgassing chuck. This can occur within a vacuum environment or outside the vacuum environment. In the latter case, the chuck can thereafter be moved to the vacuum environment. It is noted that the vacuum environment can be formed before step 1910 is executed or after. The vacuum environment can be formed by pumping gas from a vacuum chamber.

The low-outgassing chuck is connected to a low-outgassing plate.

Step 1910 is followed by at least one step out of steps 1920 and 1930.

Step 1920 includes moving the low-outgassing plate along a direction by a motor.

Step 1930 includes executing at least one additional operation that is related to the moving and differs from the supporting of the inspected object.

At least one step out of step 1920 of moving and step 1930 of executing an additional operation is executed by at least one high-outgassing associated component that is encapsulated by at least one low-outgassing covering element. The outgassing level of each of the low-outgassing plate, the low-outgassing chuck, and the at least one low-outgassing covering element does not exceed a tolerable level of outgassing in the vacuumed environment. The outgassing level of each of the at least one high-outgassing associated component is above the tolerable level of outgassing in the vacuumed environment.

Step 1930 of executing at least one additional operation can include monitoring (1932) the moving of step 1920 (for example, monitoring by a encoder), initiating (1934) the moving (for example, by sending control signals to a motor that performs the moving), controlling (1938) the moving, and moving (1936) another low-outgassing plate along another direction, wherein the moving of the other low-outgassing plate affects a position of the inspected object.

The moving (1920) can be a part of an inspection session, a metrology session or any other session during which the inspected object (or a portion thereof) are inspected, measured, evaluated and the like.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

In the claims, the word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A stage structure for use in a vacuum environment, comprising:

a first low-outgassing plate; and first high-outgassing associated components that are encapsulated by first low-outgassing covering elements, wherein the first low-outgassing plate is arranged to be coupled to a first motor that is arranged to move the first low-outgassing plate along a first direction, an outgassing level of each of the first low-outgassing plate and the first low-outgassing covering elements does not exceed a first level of outgassing in the vacuum environment, and an outgassing level of each first high-outgassing associated component is above the first level of outgassing in the vacuum environment.

2. The stage structure according to claim 1, wherein the first motor comprises a low-outgassing magnet channel and high-outgassing coils that are proximate to the magnet channel, and the high-outgassing coils are encapsulated by a coils low-outgassing enclosure.

3. A stage structure for use in a vacuum environment, comprising:

a first low-outgassing plate; and first high-outgassing associated components that are encapsulated by first low-outgassing covering elements, wherein the first low-outgassing plate is arranged to be coupled to a first motor that is arranged to move the first low-outgassing plate along a first direction, an outgassing level of each of the first low-outgassing plate and the first low-outgassing covering elements does not exceed a first level of outgassing in the vacuum environment, and an outgassing level of each first high-outgassing associated component is above the first level of outgassing in the vacuum environment; and wherein the first motor comprises a low-outgassing magnet channel and high-outgassing coils that are proximate to the magnet channel, and the high-outgassing coils are encapsulated by a coils low-outgassing enclosure; and wherein the coil low-outgassing enclosure comprises an output port; the stage structure comprises a low-outgassing tube; the low-outgassing tube enters the coils low-outgassing enclosure via the output port; and at least one high-outgassing cable for conveying control signals to the first motor is enclosed by the low-outgassing tube.

4. The stage structure according to claim 3, wherein the high-outgassing coils are connected to a coils frame without high-outgassing adhesive materials.

5. A stage structure for use in a vacuum environment, comprising:

a first low-outgassing plate; and first high-outgassing associated components that are encapsulated by first low-outgassing covering elements, wherein the first low-outgassing plate is arranged to be coupled to a first motor that is arranged to move the first low-outgassing plate along a first direction, an outgassing level of each of the first low-outgassing plate and the first low-outgassing covering elements does not exceed a first level of outgassing in the vacuum environment, and an outgassing level of each first high-outgassing associated component is above the first level of outgassing in the vacuum environment; and wherein the first high-outgassing associated components comprise first high-outgassing cables that are encapsulated by a first set of low-outgassing flexible bellows.

6. The stage structure according to claim 5, further comprising a first low-outgassing cooling element, wherein the first low-outgassing plate is coupled to a first low-outgassing slide that is movable along a first low-outgassing rail, the first low-outgassing rail is lubricated with a lubricant, a level of outgassing of the lubricant increases when the lubricant is heated, and the first low-outgassing cooling element is coupled to the first low-outgassing slide and is arranged to cool the lubricant.

7. The stage structure according to claim 6, wherein the first low-outgassing cooling element is provided with a cooling liquid that is provided via a high-outgassing fluid tube that is encapsulated by a low-outgassing flexible bellows.

8. The stage structure according to claim 6, wherein the first low-outgassing cooling element has an outer portion and an inner portion, the inner portion is arranged to enclose the first low-outgassing rail while leaving at least one gap between the inner portion and the first low-outgassing rail for trapping gas that is outgassed from the lubricant, and the at least one gap does not reach the outer portion.

9. The stage structure according to claim 5, further comprising a first high-outgassing encoder that is enclosed by a first low-outgassing encoder enclosure that comprises a window that allows the first high-outgassing encoder to read a first low-outgassing scale.

10. A stage structure for use in a vacuum environment, comprising:
   a first low-outgassing plate; and first high-outgassing associated components that are encapsulated by first low-outgassing covering elements;
   a second low-outgassing plate; and second high-outgassing associated components that are encapsulated by second low-outgassing covering elements,
   wherein the first low-outgassing plate is arranged to be coupled to a first motor that is arranged to move the first low-outgassing plate along a first direction, and the second low-outgassing plate is arranged to be coupled to a second motor that is arranged to move the second low-outgassing plate along a second direction that differs from the first direction,
   an outgassing level of each of the first low-outgassing plate and the first low-outgassing covering elements does not exceed a first level of outgassing in the vacuum environment, and an outgassing level of the second low-outgassing plate does not exceed the first level of outgassing in the vacuum environment; and
   an outgassing level of each first high-outgassing associated component is above the first level of outgassing in the vacuum environment.

11. The stage structure according to claim 10, wherein the first low-outgassing plate is connected to a first low-outgassing enclosure, the second low-outgassing plate is connected to a second low-outgassing enclosure, the first low-outgassing enclosure is connected to a first set of low-outgassing flexible bellows, and a second set of low-outgassing flexible bellows is connected between the first low-outgassing enclosure and the second low-outgassing enclosure.

12. The stage structure according to claim 11, wherein the first low-outgassing enclosure comprises a first set of ports connected to the first set of low-outgassing flexible bellows, a second set of ports that is connected to the second set of low-outgassing bellows, and a third set of ports that are connected to low-outgassing tubes that encapsulate cables that provide signals to an associated component that is coupled to the first low-outgassing plate, wherein the first low-outgassing enclosure encloses a first high-outgassing encoder arranged to detect a location of the first low-outgassing plate and encloses high-outgassing cables that are connected to components that are coupled to the first low-outgassing plate.

13. The stage structure according to claim 11, wherein the first set of low-outgassing flexible bellows are coupled to a pumping system located outside the vacuum environment for pumping gas from an interior space of the first set of low-outgassing flexible bellows.

14. The stage structure according to claim 11, wherein the second low-outgassing enclosure is connected to second rigid low-outgassing connectors that enclose high-outgassing cables to components that are connected to the second low-outgassing plate.

15. The stage structure according to claim 10, wherein the first low-outgassing covering elements comprise a first set of low-outgassing flexible bellows arranged to move along the first direction and along an opposite first direction; and wherein the second low-outgassing covering elements comprise a second set of low-outgassing flexible bellows arranged to move along the second direction and along an opposite second direction.

16. The stage structure according to claim 15, wherein the first set of low-outgassing flexible bellows are coupled to a pumping system located outside the vacuumed environment, for pumping gas from an interior space of the first set of low-outgassing flexible bellows.

17. The stage structure according to claim 10, further comprising at least one additional low-outgassing plate movable along at least one additional direction.

18. A method for operating a stage within a vacuum environment, the stage having a first low outgassing plate and a first high-outgassing associated component that is encapsulated by a first low-outgassing covering element, the method comprising:
   moving the first low-outgassing plate along a first direction with a motor; and
   executing at least one operation related to the moving by the first high-outgassing associated component encapsulated by the first low-outgassing covering element, wherein an outgassing level of each of the first low-outgassing plate and the first low-outgassing covering element does not exceed a first level of outgassing in the vacuum environment, and an outgassing level of the first high-outgassing associated component is above the first level of outgassing in the vacuum environment.

19. The method of claim 18 wherein:
   the first motor comprises a low-outgassing magnet channel and high-outgassing coils that are proximate to the magnet channel, and the high-outgassing coils are encapsulated by a coils low-outgassing enclosure; and
   the coil low-outgassing enclosure comprises an output port; the stage structure comprises a low-outgassing tube; the low-outgassing tube enters the coils low-outgassing enclosure via the output port; and at least one high-outgassing cable for conveying control signals to the first motor is enclosed by the low-outgassing tube wherein the coil low-outgassing enclosure comprises an output port; the stage structure comprises a low-outgassing tube; the low-outgassing tube enters the coils low-outgassing enclosure via the output port; and at least one high-outgassing cable for conveying control signals to the first motor is enclosed by the low-outgassing tube.

20. The method of claim 18 wherein the first high-outgassing associated components comprise first high-outgassing cables that are encapsulated by a first set of low-outgassing flexible bellows.

21. The method of claim 18 wherein the stage further comprises a second low-outgassing plate and second high-outgassing associated components that are encapsulated by second low-outgassing covering elements; and wherein the second low-outgassing plate is arranged to be coupled to a second motor that is arranged to move the second low-outgassing plate along a second direction that differs from the first direction, and an outgassing level of the second low-outgassing plate does not exceed the first level of outgassing in the vacuum environment.

* * * * *